United States Patent
Goossens et al.

(10) Patent No.: US 11,710,758 B2
(45) Date of Patent: Jul. 25, 2023

(54) OPTOELECTRONIC APPARATUS, A READING-OUT METHOD, AND A USES OF THE OPTOELECTRONIC APPARATUS

(71) Applicants: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES)

(72) Inventors: Stijn Goossens, Castelldefels (ES); Frank Koppens, Castelldefels (ES); Gerasimos Konstantatos, Castelldefels (ES)

(73) Assignees: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES)

( * ) Notice: Subject to any disclaimer, the term of this patent is extended or adjusted under 35 U.S.C. 154(b) by 213 days.

(21) Appl. No.: 17/311,419

(22) PCT Filed: Dec. 9, 2019

(86) PCT No.: PCT/EP2019/084208
§ 371 (c)(1),
(2) Date: Jun. 7, 2021

(87) PCT Pub. No.: WO2020/115328
PCT Pub. Date: Jun. 11, 2020

(65) Prior Publication Data
US 2022/0028919 A1 Jan. 27, 2022

(30) Foreign Application Priority Data
Dec. 7, 2018 (EP) .................................. 18382901

(51) Int. Cl.
*H01L 27/146* (2006.01)
*H04N 25/77* (2023.01)
(Continued)

(52) U.S. Cl.
CPC ..... *H01L 27/14665* (2013.01); *H04N 25/531* (2023.01); *H04N 25/77* (2023.01)

(58) Field of Classification Search
CPC ...... H04N 25/77; H04N 25/531; H04N 25/76; H01I 27/14665; G01J 1/44
See application file for complete search history.

(56) References Cited

U.S. PATENT DOCUMENTS

| 9,238,845 B2 * | 1/2016 | Konstantatos ...... H01L 31/0352 |
| 11,264,521 B2 * | 3/2022 | Voutilainen ..... H01L 31/035218 |

(Continued)

FOREIGN PATENT DOCUMENTS

| EP | 1 677 514 | 7/2006 |
| EP | 2 871 835 | 5/2015 |
| EP | 3 104 414 | 12/2016 |

OTHER PUBLICATIONS

International Search Report corresponding to International Patent Application No. PCT/EP2019/084208 dated Jan. 22, 2020.
(Continued)

*Primary Examiner* — Marly S Camargo
(74) *Attorney, Agent, or Firm* — Jenkins, Wilson, Taylor & Hunt, P.A.

(57) ABSTRACT

The present invention relates to an optoelectronic apparatus, comprising: —an optoelectronic device comprising: —a transport structure (T) comprising a 2-dimensional layer; —a photosensitizing structure (P) to absorb incident light and induce changes in the electrical conductivity of the transport structure (T); and—drain (D) and source (S) elec-
(Continued)

trodes electrically connected to the transport structure (T); —a read-out unit to read an electrical signal, generated at a transport channel of the transport structure (T), after an integration time interval $t_{int}$ has passed, and during a $t_{access}$ that is at least 10 times shorter than $t_{int}$, wherein $t_{int}$ is longer than a predetermined trapping time $\tau_{tr}$. The present invention also relates to a reading-out method, comprising performing the operations of the read-out unit of the apparatus of the invention, and to the use of the apparatus as a light detector or as an image sensor.

20 Claims, 6 Drawing Sheets

(51) Int. Cl.
  *H04N 25/531* (2023.01)
  *G01J 1/44* (2006.01)
  *H04N 25/63* (2023.01)

(56) References Cited

U.S. PATENT DOCUMENTS

| | | | |
|---|---|---|---|
| 11,527,662 B2* | 12/2022 | Konstantatos | H01L 31/101 |
| 2011/0068382 A1* | 3/2011 | Lauxtermann | H04N 25/77 |
| | | | 257/292 |
| 2016/0044256 A1 | 2/2016 | Yin | |
| 2016/0211392 A1* | 7/2016 | So | H01L 31/0352 |
| 2016/0233447 A1* | 8/2016 | Kim | H01L 31/00 |
| 2016/0366354 A1* | 12/2016 | Konstantatos | H04N 25/75 |
| 2017/0041564 A1* | 2/2017 | Konstantatos | H04N 25/74 |
| 2018/0115752 A1 | 4/2018 | Sato | |
| 2020/0132544 A1* | 4/2020 | Koppens | H04N 25/76 |

OTHER PUBLICATIONS

Nikitskiy et al. (2016) Integrating an Electrically Active Colloidal Quantum Dot Photodiode with a Graphene Phototransistor. Nature Communications 7:11954.
Written Opinion corresponding to International Patent Application No. PCT/EP2019/084208 dated Nov. 6, 2020.

* cited by examiner

OPTOELECTRONIC APPARATUS, A READING-OUT METHOD, AND A USES OF THE OPTOELECTRONIC APPARATUS

FIELD OF THE INVENTION

The present invention relates, in a first aspect, to an optoelectronic apparatus, comprising one or more one optoelectronic devices and an improved read-out unit that operates according to a specific timing that benefits from the underlying physics of the optoelectronic device(s).

A second aspect of the present invention relates to a reading-out method, comprising performing the operations of the read-out unit of the optoelectronic apparatus of the first aspect of the invention.

A third aspect of the present invention concerns to the use of an optoelectronic apparatus according to the first aspect of the invention, as a light detector or as an image sensor.

BACKGROUND OF THE INVENTION

Rolling shutter read-out of photodiode arrays cause effects such as wobble, skew, smear or partial exposure. To avoid these effects a storage element needs be added to the pixels that allows the charge to be dumped into a shielded area. The shielded area can then be read while the next frame is being exposed. All pixels are controlled simultaneously so that integration of the photoelectric charges starts at the same time for all pixels.

Optoelectronic apparatuses which comprise the features of the preamble clause of claim 1 of the present invention are known in the art, for example that disclosed by EP3104414A1, i.e. those which comprise:
at least one optoelectronic device comprising:
  a transport structure comprising at least one 2-dimensional layer;
  a photosensitizing structure configured and arranged to absorb incident light and induce changes in the electrical conductivity of the transport structure by generating pairs of electric carriers, trapping a single type of electric carriers of said pairs therein, during a predetermined trapping time $\tau_{tr}$, to induce a change in the conductance of the transport structure; and
  drain and source electrodes electrically connected to respective separate locations of said transport structure;
and
a read-out unit operatively connected to said drain and source electrodes to read an electrical signal generated at a transport channel (such as an electrical signal indicative of electrical resistance) created in said transport structure between the drain and source electrodes by the light impinging on said photosensitizing structure.

In those optoelectronic apparatuses, i.e. apparatuses comprising hybrid 2D material-photosensitizing structure photoconductors, when used as image sensors, the accumulated charges that are trapped in the sensitization layer make up the electronic representation of the image.

In high impedance photoconductive detectors, it is possible to implement a quasi-global shutter by reading all pixels at the same time. However, in the apparatuses comprising hybrid 2D material-sensitizing layer optoelectronic devices that have a low impedance, such as that disclosed by EP3104414A1, this is in practice impossible due to the large power consumption. A pixel array of 1 Million pixels with each a resistance of 1 kΩ, biased with 1V source-drain bias would draw 1 kW of power, making unfeasible to apply a quasi-global shutter read-out.

Therefore, conventionally, for those kind of optoelectronic apparatuses a rolling shutter read-out is performed, hence having the above mentioned negative effects associated thereto.

It is, therefore, necessary to provide an alternative to the state of the art which covers the gaps found therein, by providing an optoelectronic apparatus including an optoelectronic device as described above, i.e. one comprising a hybrid 2D material-photosensitizing structure, but which does not possess the above mentioned negative effects, by including a read-out unit configured to circumvent rolling shutter artefacts while avoiding large power consumption.

SUMMARY OF THE INVENTION

To that end, the present invention relates, in a first aspect, to an optoelectronic apparatus, comprising:
at least one optoelectronic device comprising:
  a transport structure comprising at least one 2-dimensional layer;
  a photosensitizing structure configured and arranged to absorb incident light and induce changes in the electrical conductivity of the transport structure by generating pairs of electric carriers, trapping a single type of electric carriers of said pairs therein, during a predetermined trapping time $\tau_{tr}$, to induce a change in the conductance of the transport structure; and
  drain and source electrodes electrically connected to respective separate locations of said transport structure;
and
a read-out unit operatively connected to said drain and source electrodes to read an electrical signal generated at a transport channel (such as an electrical signal indicative of electrical resistance) created in said transport structure between the drain and source electrodes by the light impinging on said photosensitizing structure.

The electrical signal generated at the transport channel is therefore transported therethrough between the source and drain electrodes.

In contrast to the apparatuses known in the prior art, the read-out unit of the apparatus of the present invention, in a characterizing manner, is made and arranged to perform the above mentioned reading of said electrical signal after an integration time interval $t_{int}$ has passed, and during a time interval $t_{access}$ that is at least 10 times shorter than $t_{int}$, wherein $t_{int}$ is longer than $\tau_{tr}$ and corresponds to the time interval during which integration of photo-generated electric charges occurs in the photosensitizing structure.

Hence, by means of the present invention, the timing scheme implemented by the read-out unit takes into account and benefits from the fact that the photosensitizing structure is used as an inherent charge storage element.

In this way, by means of the present invention, most of the typical rolling shutter artefacts such as wobble, skew, smear and partial exposure are avoided.

For some embodiments, the optoelectronic apparatus of the first aspect of the present invention comprises several of said at least one optoelectronic devices.

For some embodiments, said time interval $t_{access}$ is between 100 times and 200000 times shorter than $t_{int}$. The more the amount of optoelectronic devices included in the apparatus the higher the number of times that $t_{access}$ is shorter than $t_{int}$. Some specific examples will be given in a posterior section of the present document, for working embodiments of optoelectronic apparatuses having a different number of optoelectronic devices grouped forming arrays.

The optoelectronic apparatus of the first aspect of the invention comprises, for an embodiment, an array of said at least one optoelectronic devices forming at least one row, wherein the read-out unit is operatively connected to the drain and source electrodes of all the optoelectronic devices of the array, to simultaneously read electrical signals generated at the transport channels of the optoelectronic devices of the at least one row, wherein the read-out unit is made and arranged to perform the reading of all of said electrical signals after the integration time interval $t_{int}$ has passed, and during the time interval $t_{access}$.

Although, for an embodiment, said array of optoelectronic devices forms only one row, for a preferred embodiment the array comprises optoelectronic devices forming at least a first and a second row, wherein the read-out unit is operatively connected to the drain and source electrodes of the optoelectronic devices of the array to simultaneously read the electrical signals generated at the transport channels of the optoelectronic devices of the first row during time interval $t_{access}$, and then simultaneously read the electrical signals generated at the transport channels of the optoelectronic devices of the second row during time interval $t_{access}$; wherein the read-out unit is made and arranged to perform the reading of all of said electrical signals after the integration time $t_{int}$ has passed, and during a time $t_{frame}=t_{access}*nr_{rows}$, wherein $nr_{rows}$ indicates the number of rows of optoelectronic devices.

In other words, the rows of optoelectronic devices are read in sequence, one after the other, but the optoelectronic devices of each row are read simultaneously during a time interval $t_{access}$ for each row.

According to an embodiment, the read-out unit is configured and arranged to shut off during the presence of each of a plurality of integration time intervals $t_{int}$ starting after corresponding light level changes of the light impinging on the photosensitizing structure, for power consumption saving.

For a first implementation of the optoelectronic apparatus of the first aspect of the present invention, the read-out unit is configured and arranged to perform one reading per optoelectronic device every integration time interval $t_{int}$.

Alternatively, for a second implementation of the optoelectronic apparatus of the first aspect of the present invention, more elaborated than the first one, the read-out unit comprises a control mechanism configured and arranged to control and synchronize the timing of the integration of the photo-generated electric charges through a plurality of successive integration time intervals $t_{int}$ and remove excess electric charges from previous integration time intervals $t_{int}$, for the at least one optoelectronic device or each of the optoelectronic devices simultaneously.

For a first variant of said second implementation, the control mechanism is configured and arranged to generate and apply a reset electric pulse to an electrode of the at least one optoelectronic device or of each of the optoelectronic devices simultaneously, to remove the electric charges trapped in the photosensitizing structure or in each of the photosensitizing structures, in a controlled manner, so that an integration time interval $t_{int}$ starts after said reset electric pulse has been applied, and thus the time at which $t_{int}$ starts does not depend on the light impinging on the photosensitizing structure but is accurately and actively controlled.

Depending on the embodiment, and particularly on the architecture of the optoelectronic device(s), said electrode is at least one of a top gate electrode, a bottom gate electrode, and a top electrode comprised by the optoelectronic devices(s).

Preferably, the control mechanism is configured and arranged to apply the above mentioned reset electric pulse immediately after the reading of the electrical signal (when the apparatus only comprises one optoelectronic device) or of all of the electrical signals (when the apparatus comprises several optoelectronic devices) generated at the transport channel(s) has been carried out.

Generally, one of said reset electric pulses is applied after each of said electrical signal(s) reading is carried out, so that further and consecutive integration time intervals $t_{int}$ start after each of said reset electric pulses has been applied.

Alternatively, for a second variant of the second implementation, the control mechanism comprises a controllable light source, and is configured and arranged to control said controllable light source:

to switch on the controllable light source to generate and emit a light pulse to illuminate an object during a time interval $t_{\_pls}$ including each integration time interval $t_{int}$ and the time interval, $t_{access}$ or $t_{frame}$, during which the electrical signal or electrical signals has/have been read, and to switch off said controllable light source during a switch off time interval $t_{\_off}$ of equal duration as $t_{int}$ and that is immediately consecutive to $t_{\_pls}$ to allow for photo-generated charges to leak out of the optoelectronic device and put the optoelectronic device back in its dark state;

wherein the at least one optoelectronic device or each of the optoelectronic devices is arranged so that the light impinging on the photosensitizing structure(s) is a portion of the light included in the above mentioned light pulse once reflected by or transmitted through the object.

Preferably, the control mechanism is configured and arranged to control the controllable light source to periodically repeat the switching on and switching off of the controllable light source, to generate and emit further light pulses during corresponding further time intervals $t_{\_pls}$, each immediately after a respective further switch off interval $t_{\_off}$.

For an embodiment, the optoelectronic apparatus of the first aspect of the present invention further comprises one or more bandpass filters, with centre wavelength around the wavelength of the light pulse(s) and a predetermined bandwidth, placed over the photosensitizing structure(s).

For some applications of the second variant of the second implementation of the optoelectronic apparatus of the first aspect of the present invention the wavelength of the light pulse(s) is a terahertz, mid-infrared, short wave infrared or near-infrared wavelength.

Examples of those applications are night vision systems (for example, for obstacle detection) and eye-tracking systems.

For some embodiments, the photosensitizing structure comprises one or more photosensitizing layers comprising a photo-absorbing semiconductor, a polymer, a dye, quantum dots (such as for instance colloidal quantum dots), Perovskite and/or a combination thereof (such as in the form of blends).

For those embodiments for which the one or more photosensitizing layers comprise quantum dots, they are of one or more of the following types: $Ag_2S$, $Bi_2S_3$, $CdS$, $CdSe$, CdHgTe, $Cu_2S$, CIS (copper indium disulfide), CIGS (copper indium gallium selenide), CZTS (copper zinc tin sulfide), Ge, HgTe, InAs, InSb, ITO (indium tin oxide), PbS, PbSe, Si, $SnO_2$, ZnO, and ZnS.

In some embodiments, the at least one layer of a two-dimensional material comprised in the transport layer comprises one or more of the following materials: graphene (pure graphene, modified graphene, single layer, bilayer, few layer or functionalized graphene), $MoS_2$, $MoSe_2$, $WS_2$, $WSe_2$, black phosphorus, $SnS_2$, and h-BN (hexagonal boron nitride).

The present invention also relates, in a second aspect, to a reading-out method, comprising performing the operations of the read-out unit of the optoelectronic apparatus of the first aspect of the invention.

The description of all the embodiments of the optoelectronic apparatus of the first aspect of the invention, regarding the operations of the read-out unit, is also valid for describing corresponding embodiments of the reading-out method of the second aspect.

A third aspect of the present invention concerns to the use of an optoelectronic apparatus according to the first aspect of the invention, as a light detector or as an image sensor.

The applications of the present invention are in the broad photodetection field. Any photodetector based on a transport structure comprising a 2D material and a photosensitizing structure configured and arranged to absorb incident light and induce changes in the electrical conductivity of the transport structure benefits from the present invention.

The preferred application of the present invention is to implement light detectors for light that impinges vertically, especially image sensors having several pixels (forming linear or 2D arrays).

Moreover, the present invention can also be used for distance sensing applications, for example in the form of a photoelectric receiver arranged to detect light reflected on or radiated by an object.

Other applications of the present invention include ambient light sensing, LIDAR (Light Detection and Ranging o Laser Imaging Detection and Ranging) systems, and single pixel photodetectors.

BRIEF DESCRIPTION OF THE FIGURES

In the following some preferred embodiments of the invention will be described with reference to the enclosed figures. They are provided only for illustration purposes without however limiting the scope of the invention.

FIG. 3 shows different structures for implementing the optoelectronic device of FIG. 1 that lead to different trapping times by controlling the resistance of the recombination channel. On the left: a stack of graphene and PbS colloidal quantum dots gives a typical $\tau_{tr}$=100 μs. At t=0 the light is switched off. Note that the dark current of the device is subtracted. The fit is performed with formula (1) given below. On the right: a stack of graphene, semiconductor interlayer and PbS colloidal quantum dots leads to $\tau_{tr}$~1 ms. At t=0 the light is switched off and halfway the trace it is switched on again. Note that in this device the photoresponse is inverted as compared to the graphene/quantum dot stack. The fit is performed with formula (2) given below, including an offset value for the dark current (in this plot the dark current of the device was not subtracted).

DESCRIPTION OF THE PREFERRED EMBODIMENTS

In the present section, three different embodiments of the apparatus of the first aspect of the present invention will be described with reference to the accompanying Figures, particularly denoted as "Embodiment 1" (referred in a previous section as first implementation of the optoelectronic apparatus of the first aspect of the present invention), "Embodiment 2" (referred in a previous section as first variant of a second implementation), and "Embodiment 3" (referred in a previous section as second variant of a second implementation).

Embodiment 1

Figure 1:
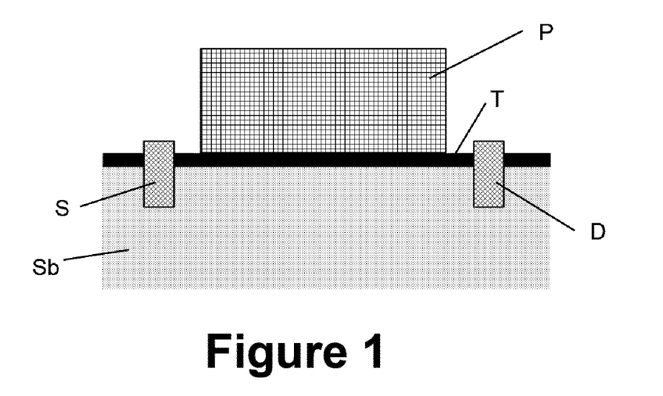
FIG. 1 shows an optoelectronic device of the apparatus of the first aspect of the present invention, for implementing an embodiment referred below as "Embodiment 1", and that has been referred in a previous section as first implementation.

Embodiment 1 can be implemented with an optoelectronic device constituting a pixel that has a pixel structure as that illustrated in FIG. 1, which comprises a transport structure T comprising at least one layer of 2D material, a photosensitizing structure P comprising a layer of sensitizing material, one source electrode S and one drain electrode D, arranged on a substrate Sb.

Figure 2:
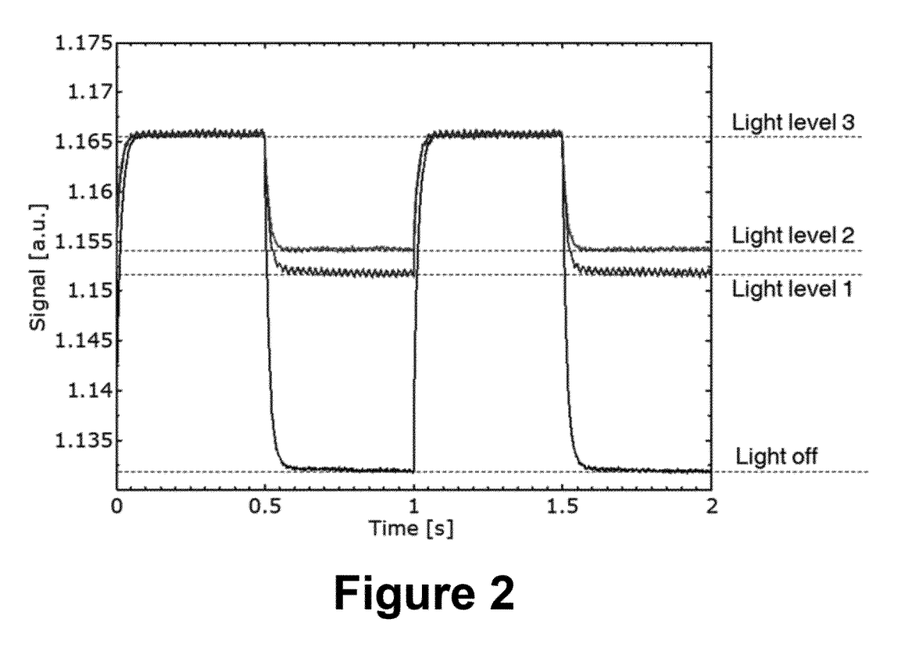
FIG. 2 plots the response of a pixel constituted by the optoelectronic device of FIG. 1, versus time while illuminating with a 1 Hz modulated light source between different light levels.
Figure 3:
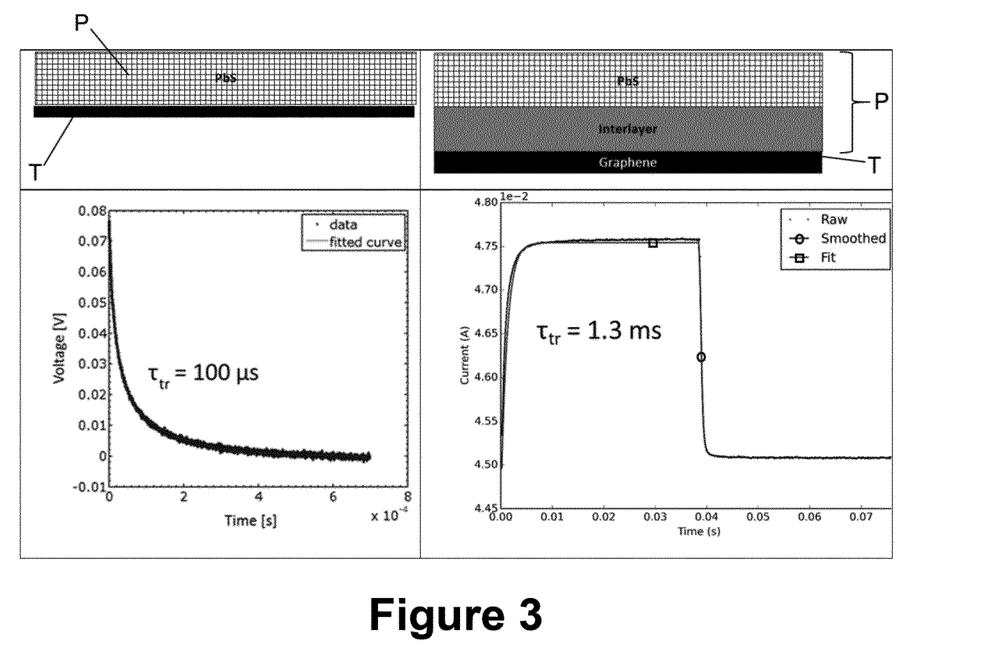

The pixel response to different and quasi-instantly changing light levels over time is plotted in FIG. 2 for three different light levels (Light levels 1, 2 and 3) and a light off situation FIG. 2. An exponential relation describes the transient behaviour of a pixel (with positive signal change upon illumination) responding to a quasi-instant change of light level from high to low as follows (see also FIG. 3, left):

$$S=(S_1-S_2)e^{-t/\tau_{tr}} \quad (1)$$

Where S is the signal level, $S_1$ the signal level at the initial light level and $S_2$ the signal level at the final light level and $\tau_{tr}$ the trapping time of the quantum dots.

A similar exponential relation describes the transient behaviour of the optoelectronic device (with positive signal change upon illumination) responding to an instant change of light level from low to high:

$$S=(S_1-S_2)(1-e^{-t/\tau_{tr}}) \quad (2)$$

It is clear from these formulas that the trapping time $\tau_{tr}$ is the relevant time scale for both transient behaviours. It is a fixed intrinsic time scale and depends on the details of the optoelectronic device stack. A vertical pixel structure comprising a layer of graphene in direct electrical contact with a layer of quantum dots has a typical $\tau_{tr}$ of 100 μs.

It is possible to tailor the electronic interface between the photoactive layer and transport structure to improve the performance of the device in achieving more efficient charge transfer, tailoring the temporal response and improve the stability of the device. The interlayer barrier comprises $TiO_2$; Alumina; ZnO; Hafnia; colloidal quantum dots; single or few layer two-dimensional material including hexagonal boron nitride, black phosphorus, $MoS_2$, $WS_2$, $WSe_2$ or other transition metdichalcogenides; or a self-assembled monolayer of organic molecules including Ethane-, propane-, butane-, octane-, dodecane-, benzene-, biphenyl-, terphenyl- or quaterphenyl-dithiol molecules. The thickness of the interlayer barrier may vary from 0.1 nm up to 1 μm.

A vertical pixel structure of graphene, interlayer and quantum dots has a typical $\tau_{tr}$ of 1 ms (FIG. 3).

It is important to note that it takes always the same time for the signal level of the detector to reach the new signal level corresponding to the new light level. This leads to an effect called image lag. Every frame that is read contains a finite amount of information from the previous frame. Not only when the pixel goes from light to dark, but also from one light level to another light level. The image lag (IL in [%]) in a pixel at read time $t_{read}$ can be described by the following relation:

$$IL=100*e^{-t_{read}/\tau_{tr}} \quad (3)$$

Every imaging application has a certain requirement in terms of image lag, for example 1% or 0.1%, hence the reading of all pixels needs to occur after a read time when this image lag requirement can be satisfied. This read time we call the integration time $t_{int}$. The integration time is a function of the trapping time $\tau_{tr}$ and the image lag IL (in percent) as follows:

$$t_{int}=-\tau_{tr}*\log(IL/100)$$

A typical image lag is 0.1% or 1%. In case the $\tau_{tr}$ is 1 ms, the $t_{int}$ needs to be 2 ms for an image lag of 1% or 3 ms for an image lag of 0.1%.

The $t_{int}$ can be set in the read-out electronics, i.e. in the read-out unit, of the optoelectronic apparatus. From the electronics point of view, it is the time set in the read-out unit to wait for an image to build up in the sensor, when the apparatus is an image sensor comprising a pixel array of optoelectronic devices, i.e. of photodetectors.

The total time to capture the resistance of all the pixels in the photodetector array using one amplifier for each column setup is at least:

$$t_{frame}=t_{access}*nr_{rows}$$

where $t_{access}$ is the time in which the electronics reads the resistance of one pixel (in case of a column parallel read-out, this is directly an entire row) and $nr_{rows}$ is the number of rows. $t_{access}$ can be set by the electronics and can typically be varying from 10 ns to 10 ms and its maximum value depends on the ratio $t_{int}/t_{frame}$, $t_{int}$ and $nr_{rows}$:

$$t_{access,max} = \frac{t_{int}}{t_{int}/t_{frame}*nr_{rows}} \quad (4)$$

Figure 4:
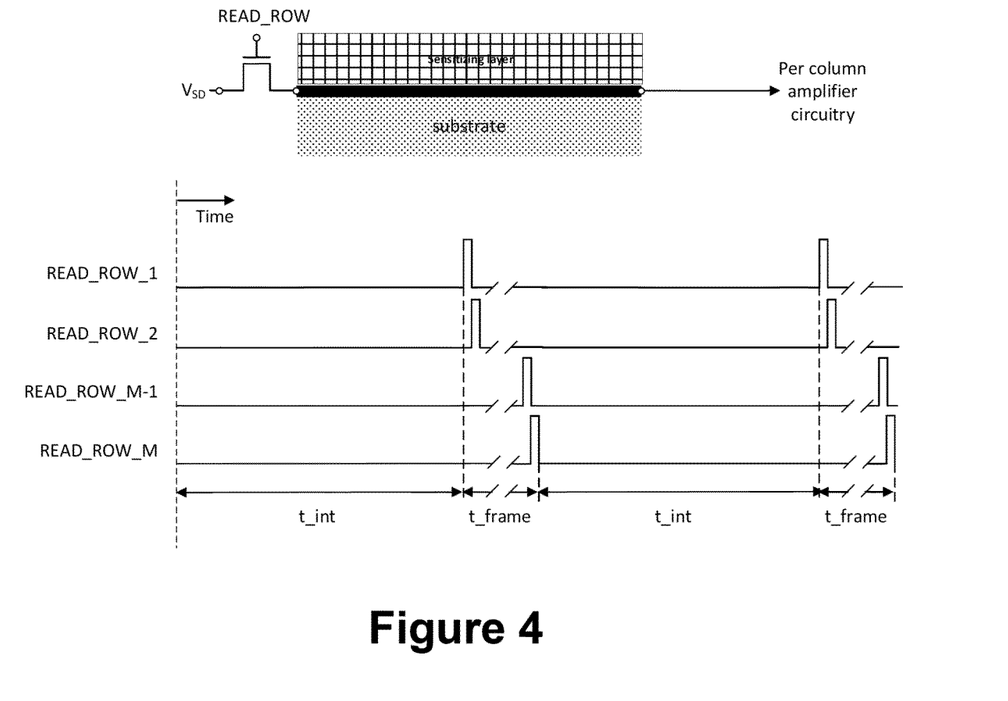
FIG. 4: Top: structure for implementing the optoelectronic device of Embodiment 1 (in case of a per column amplifier scheme, as is illustrated in FIG. 5). Bottom: timing diagram for read sequence for Embodiment 1. The length of the READ_ROW pulses are $t_{access}$. For clarity sake, the timings are not drawn to scale.
Figure 5:
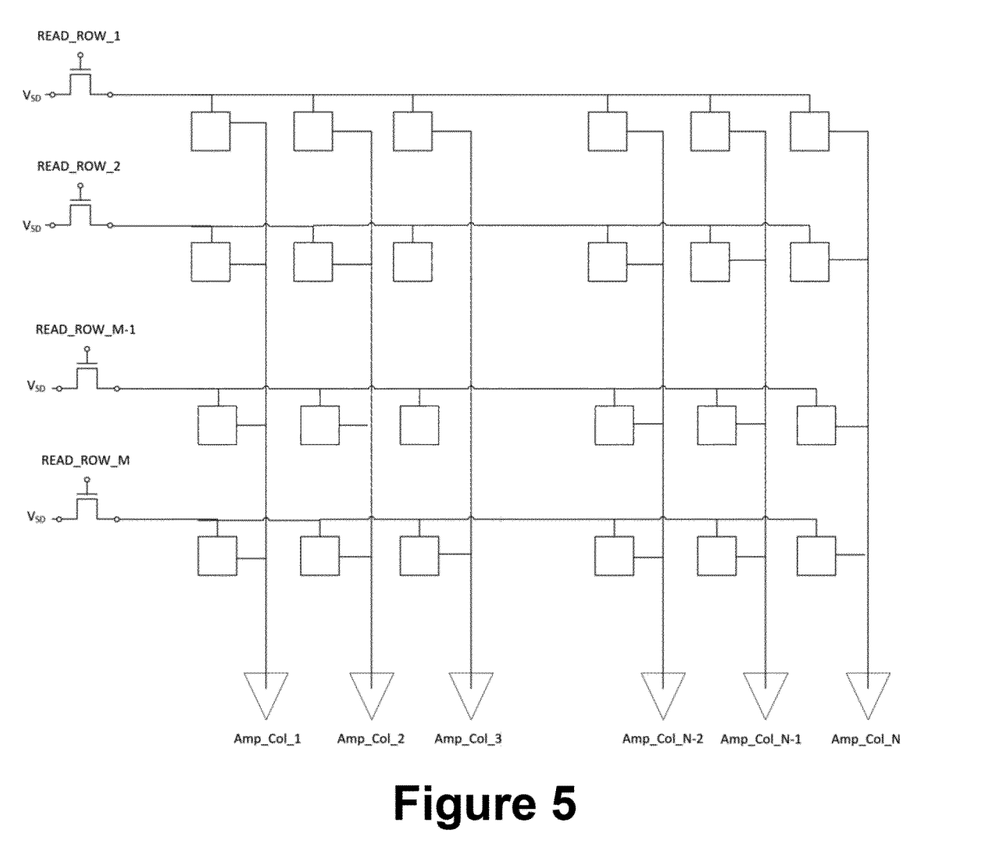
FIG. 5: Schematic layout of an M×N array of optoelectronic devices or pixels, for implementing embodiment 1, where each depicted square is a pixel/optoelectronic device.
Figure 6:
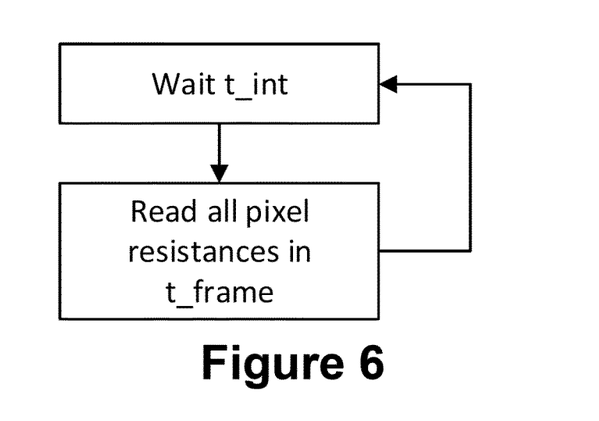
FIG. 6: Read sequence for Embodiment 1.

To achieve the read-out implementation of Embodiment 1, the present inventors designed an image sensor array with the capabilities of achieving $t_{int}/t_{frame}>>1$, exploiting the intrinsic integration properties of the detector, and used a read-out sequence as that illustrated in FIG. 4 and FIG. 6, specifically for the pixel array arrangement depicted in FIG. 5, i.e. for an array of pixels forming M rows and N columns, where the source electrodes of the pixels (i.e. of the optoelectronic devices) of each row are operatively/electrically connected to a common source-drain bias voltage $V_{SD}$ to be applied when a respective switch (READ_ROW_1 to READ_ROW_M) is switched on, in order to simultaneously read the pixels (i.e. the electrical signal of the transport channels thereof) of each row, in this case through respective amplifiers (Amp_Col_1 to Amp_Col_N) each operatively/electrically connected to the pixels of one column of the array, specifically to the drain electrodes thereof.

The amplifiers (Amp_Col_1 to Amp_Col_N), bias circuits (switches READ_ROW_1 to READ_ROW_M, source-drain bias voltage $V_{SD}$, and corresponding electrical connections), and other (not shown) components (a processor for processing an algorithm implementing the read sequence of FIG. 6 according to the timing diagram of FIG. 4, memories, A/D converters, digital and analogue circuitry, etc.) form the read-out unit of the apparatus of the first aspect of the present invention.

The larger $t_{int}/t_{frame}$, the more wobble, skew, smear and partial exposure artefacts will be suppressed.

A few examples of the maximal access time $t_{access,\,max}$ to satisfy the required $t_{int}/t_{frame}$ are shown in the following table, for different resolutions for the pixel array. It must be pointed out that $t_{access,\,max}$ only differs from $t_{access}$, if so, in that the former is the one set in the read-out unit so that there is time enough to carry out the readings of all the electrical signals, i.e. of all the pixels. Then, generally, $t_{access,\,max}$ is slightly higher than $t_{access}$ to be sure that all the readings are performed.

TABLE 1

Typical values of $t_{access,\,max}$

| Resolution [row × col] | $t_{int}/t_{frame}$ | $t_{int}$ [ms] | $t_{frame}$ [μs] | $t_{access,max}$ [ns] | $t_{int}/t_{access,max}$ |
|---|---|---|---|---|---|
| 380 * 280 | 10 | 2 | 200 | 526 | 3802 |
| 640 * 480 | 10 | 2 | 200 | 313 | 6390 |
| 1024 * 768 | 10 | 2 | 200 | 195 | 10256 |
| 1280 * 1024 | 10 | 2 | 200 | 156 | 12820 |
| 1280 * 1024 | 10 | 0.2 | 20 | 16 | 12500 |
| 1280 * 1024 | 100 | 2 | 20 | 16 | 125000 |
| 1280 * 1024 | 100 | 0.2 | 2 | 1.6 | 125000 |

As stated in a previous section, and indicated in claim 1 of the present invention, although for the values indicated in Table 1 $t_{access,\ max}$ is from 3802 to 125000 shorter that $t_{int}$, for some embodiments, such as those for which the apparatus only includes one optoelectronic device (that's the case, for example, of a single-pixel image sensor) $t_{access,\ max}$ can be much lower, even only 10 times shorter than $t_{int}$.

During time $t_{int}$ the read-out circuitry, i.e. the read-out unit, can be shut off, reducing power consumption by a factor $t_{int}/t_{frame}$.

Embodiment 2

In Embodiment 2, a means for controlling the detector sensitivity and the timing of integration of photoinduced charges on the sensitization layer for all pixels in the array simultaneously was added. This can be achieved by adding electrodes that modify the band structure of the device ([1] Nikitskiy et al. 2016) in order to control the trapping time $\tau_{tr}$ and/or to remove the trapped charges in the sensitization layer P in a controlled manner, when a reset electric pulse is applied to the electrodes of all the optoelectronic devices simultaneously.

Figure 7:
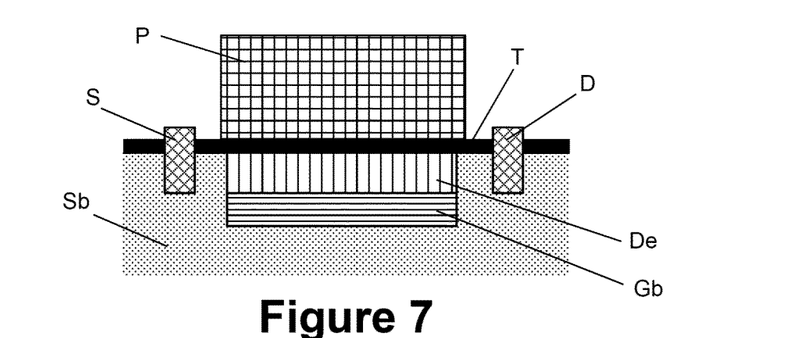
FIGS. 7 to 9 show different alternative structures of an optoelectronic device of the apparatus of the first aspect of the present invention, for implementing an embodiment referred below as "Embodiment 2", and that has been referred in a previous section as first variant of a second implementation.
Figure 8:
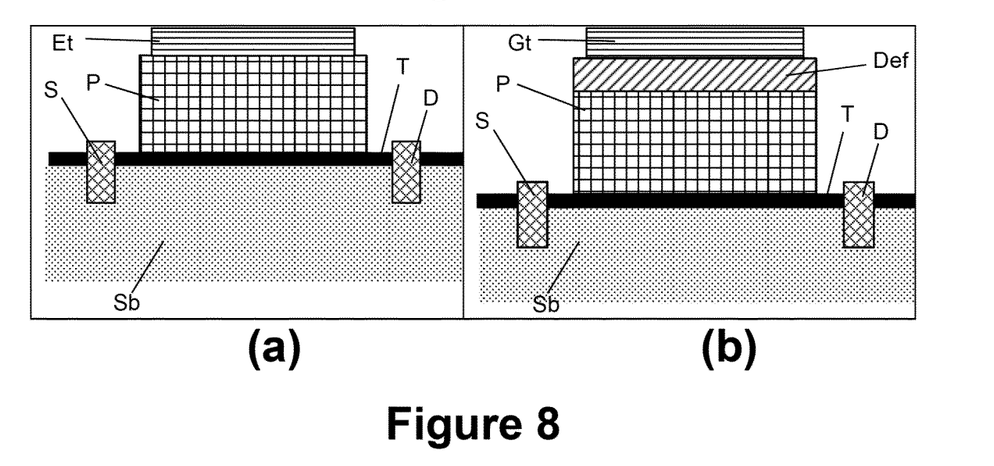
Figure 9:
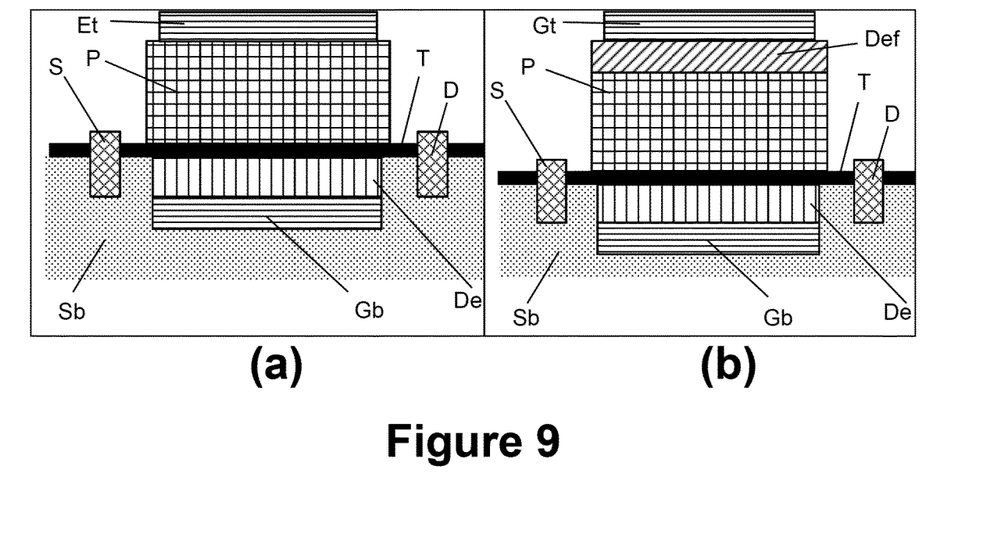

In FIGS. 7 to 9 different pixel/optoelectronic device structures that could achieve this control are illustrated, particularly:

FIG. 7: a structure comprising a conductive bottom gate electrode structure Gb separated from the transport structure T by means of a dielectric structure/layer De.

FIG. 8(a): a structure comprising a top electrode Et electrically connected (ohmic contact or Schottky contact) to the photosensitizing structure P.

FIG. 8(b): a structure comprising a conductive top gate electrode structure Gt separated from the transport structure T by means of a dielectric structure/layer Def.

FIG. 9(a): a structure comprising both, a top electrode Et electrically connected (ohmic contact or Schottky contact) to the photosensitizing structure P, and a conductive bottom gate electrode structure Gt separated from the transport structure T by means of a dielectric structure/layer De.

FIG. 9(b): a structure comprising both, a conductive top gate electrode structure Gt separated from the transport structure T by means of a dielectric structure/layer Def, and a conductive bottom gate electrode structure Gt separated from the transport structure T by means of a dielectric structure/layer De.

Figure 10:
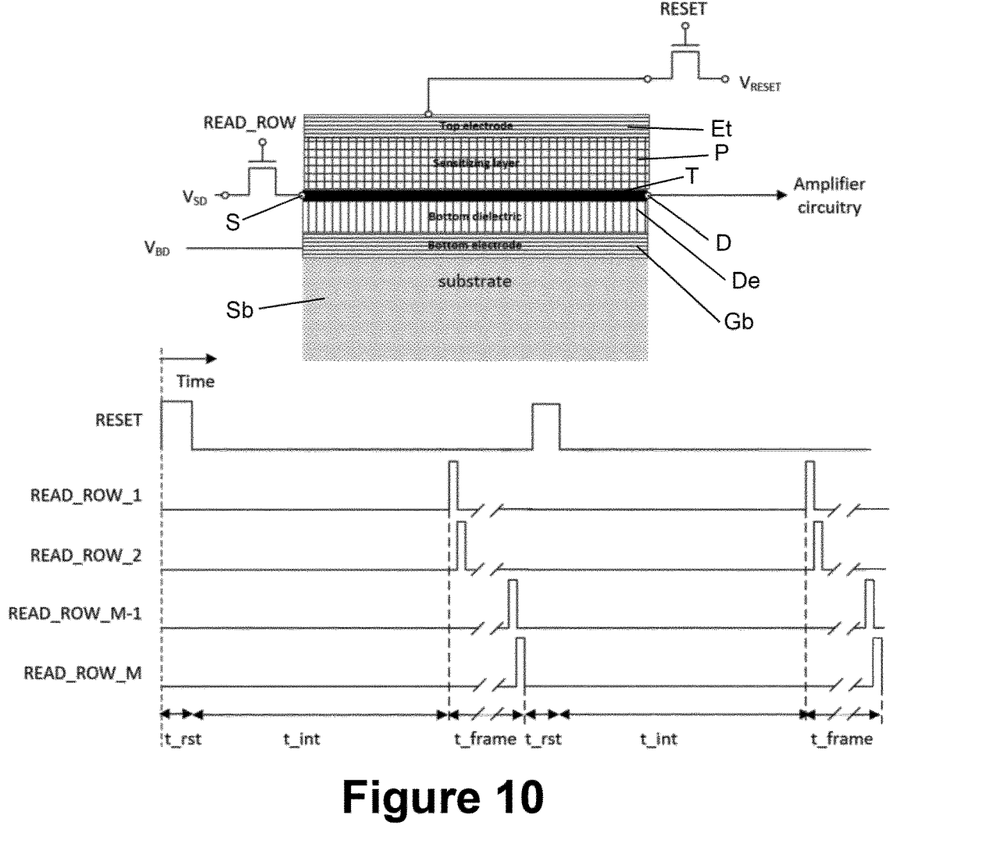
FIG. 10: Top: structure for implementing the optoelectronic device of Embodiment 2 (in case of a per column amplifier array, as is illustrated in FIG. 5), particularly that depicted in FIG. 9(a). Bottom: timing diagram for read sequence for Embodiment 2. The length of the READ_ROW pulses are $t_{access}$. For clarity sake, the timings are not drawn to scale.
Figure 11:
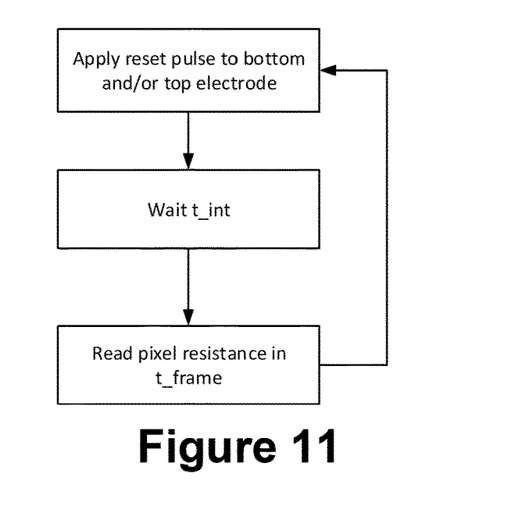
FIG. 11: Read sequence for Embodiment 2.

FIG. 10 and FIG. 11 depict the sequence of reading the photodetector array, in this case for the arrangement of FIG. 9(a), although the same sequence is used for the rest of alternative arrangements depicted in FIGS. 7, 8, and 9(b).

Particularly, FIG. 11 shows the flow diagram of the sequence to be performed by an algorithm processed by the read-out unit according to the timing diagram of FIG. 10.

As shown in the timing diagram of FIG. 10, a reset electric pulse is applied (though $t_{\_rst}$) immediately after each reading of all of the electrical signals (read as for Embodiment 1, i.e. row by row), i.e. immediately after each $t_{frame}$.

Embodiment 3

Figure 12:
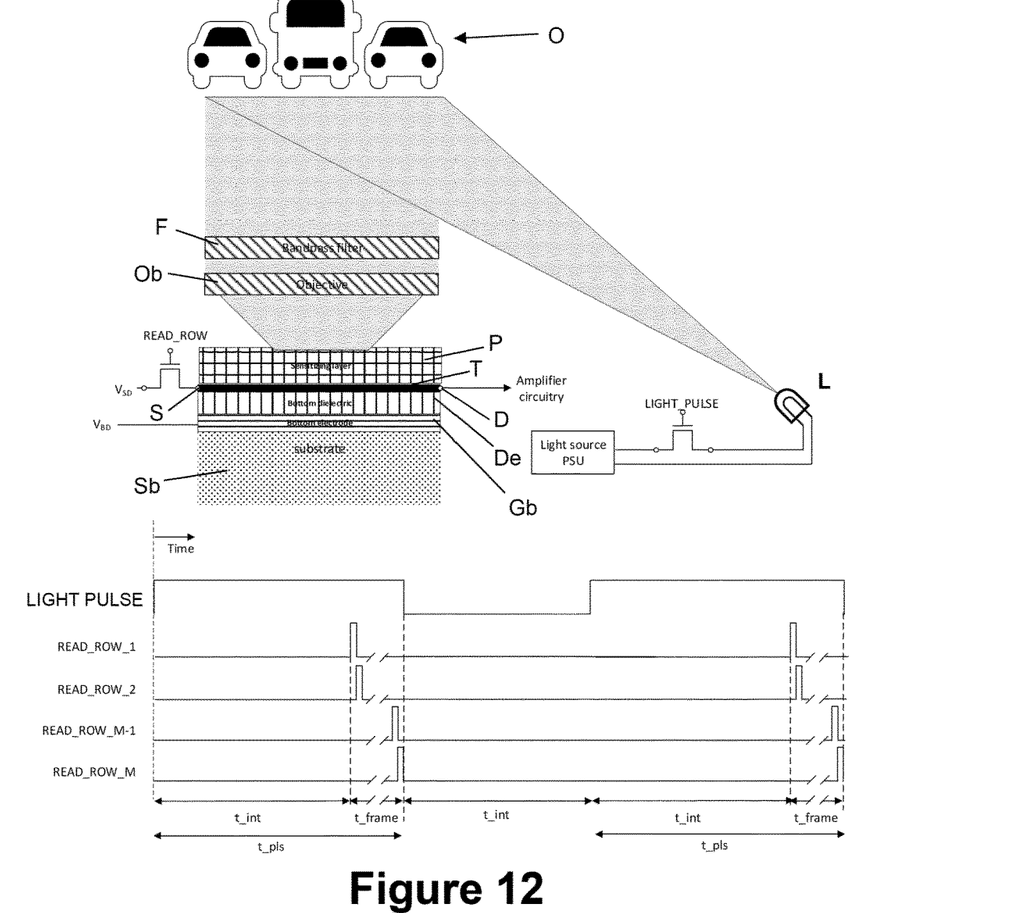
FIG. 12: Top: schematic drawing of implementation of an embodiment referred below as "Embodiment 3, and that has been referred in a previous section as first variant of a second implementation. The drawing includes the apparatus of the first aspect of the invention and some objects to be detected thereby. Bottom: timing diagram for read sequence for Embodiment 3 (in case of a per column amplifier array, as is illustrated in FIG. 5). The length of the READ_ROW and pulses are $t_{access}$. For clarity sake, the timings are not drawn to scale.
Figure 13:
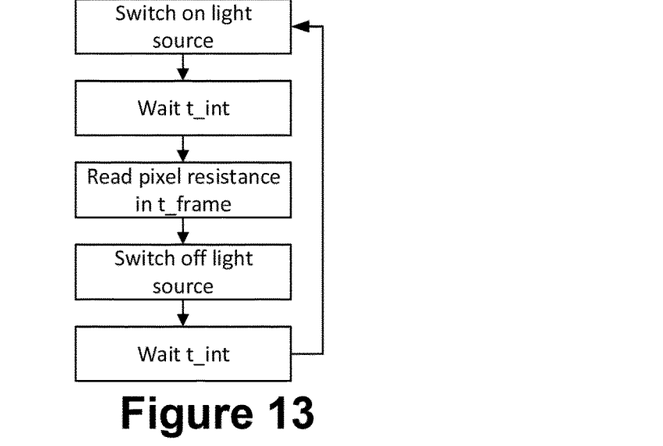
FIG. 13: Read sequence for Embodiment 3.

Another way to achieve synchronization of the integration of photogenerated charges and provide the ability to remove excess charges from previous integration periods is to use an active, shuttered light source and a synchronized read-out of the pixel array. A possible scheme is illustrated in FIG. 12 and FIG. 13, the latter illustrating by means of a flow diagram of the sequence to be performed by an algorithm processed by the read-out unit, according to the timing diagram of FIG. 12.

The controllable light source L (in this case controllable just by the switching of a switchable power supply "Light source PSU") needs to be switched on for a time $t_{int}+t_{frame}$ to allow integration of the photogenerated charges and read-out of the pixels in the array. Then the controllable light source L is switched off for a time $t_{int}$ to allow the pixels to relax to the dark state.

To reduce the influence of background light a bandpass filter F with center wavelength around the active light source wavelength and bandwidth dlambda should be placed in front of the optoelectronic device, in this case in front of an objective Ob placed in front of the photosensitizing structure P. This can be either a discrete optical component or an on-chip filter.

For the illustrated embodiment, the apparatus is used for viewing/detecting objects O, in this case vehicles. It could be, for example, implemented in an obstacle detection system of a vehicle.

A person skilled in the art could introduce changes and modifications in the embodiments described without departing from the scope of the invention as it is defined in the attached claims.

REFERENCES

[1] Nikitskiy, Ivan, Stijn Goossens, Dominik Kufer, Tania Lasanta, Gabriele Navickaite, Frank H. L. Koppens, and Gerasimos Konstantatos. 2016. "Integrating an Electrically Active Colloidal Quantum Dot Photodiode with a Graphene Phototransistor." *Nature Communications* 7:11954.

The invention claimed is:

1. An optoelectronic apparatus, comprising:
   at least one optoelectronic device comprising:
      a transport structure comprising at least one 2-dimensional layer;
      a photosensitizing structure configured and arranged to absorb incident light and induce changes in the electrical conductivity of the transport structure by generating pairs of electric carriers, trapping a single type of electric carriers of said pairs therein, during a predetermined trapping time $T_{tr}$, to induce a change in the conductance of the transport structure; and
      drain and source electrodes electrically connected to respective separate locations of said transport structure;
   a read-out unit operatively connected to said drain and source electrodes to read an electrical signal generated at a transport channel created in said transport structure between the drain and source electrodes by the light impinging on said photosensitizing structure;
wherein said read-out unit is made and arranged to perform said reading of said electrical signal after an integration time interval $t_{int}$ has passed, and during a time interval $t_{access}$ that is at least 10 times shorter than $t_{int}$, wherein $t_{int}$ is longer than $T_{tr}$ and corresponds to the time interval during which integration of photo-generated electric charges occurs in the photosensitizing structure.

2. The optoelectronic apparatus according to claim 1, wherein said time interval $t_{access}$ is between 100 times and 200000 times shorter than $t_{int}$.

3. The optoelectronic apparatus according to claim 1, comprising an array of said at least one optoelectronic device forming at least one row, wherein said read-out unit is operatively connected to the drain and source electrodes of all the optoelectronic devices of said array, to simultaneously read electrical signals generated at the transport channels of the optoelectronic devices of the at least one row, wherein the read-out unit is made and arranged to perform the reading of all of said electrical signals after said integration time interval $t_{int}$ has passed, and during said time interval $t_{access}$.

4. The optoelectronic apparatus according to claim 3, wherein said array comprises optoelectronic devices forming at least a first and a second row, wherein the read-out unit is operatively connected to the drain and source electrodes of the optoelectronic devices of the array to simultaneously read the electrical signals generated at the transport channels of the optoelectronic devices of the first row during time interval $t_{access}$, and then simultaneously read the electrical signals generated at the transport channels of the optoelectronic devices of the second row during time interval $t_{access}$, wherein the read-out unit is made and arranged to perform the reading of all of said electrical signals after said integration time $t_{int}$ has passed, and during a time $t_{frame} = t_{access} * nr_{rows}$, wherein $nr_{rows}$ indicates the number of rows of optoelectronic devices.

5. The optoelectronic apparatus according to claim 1, wherein the read-out unit is configured and arranged to shut off during the presence of each of a plurality of integration time intervals $t_{int}$ starting after corresponding light level changes of the light impinging on the photosensitizing structure, for power consumption saving.

6. The optoelectronic apparatus according to claim 1, wherein the read-out unit is configured and arranged to perform one reading per optoelectronic device every integration time interval $t_{int}$.

7. The optoelectronic apparatus according to claim 1, wherein the read-out unit comprises a control mechanism configured and arranged to control and synchronize the timing of the integration of the photo-generated electric charges through a plurality of successive integration time intervals $t_{int}$ and remove excess electric charges from previous integration time intervals $t_{int}$, for the at least one optoelectronic device.

8. The optoelectronic apparatus according to claim 7, wherein said control mechanism is configured and arranged to generate and apply a reset electric pulse to an electrode of the at least one optoelectronic device, to remove the electric charges trapped in the photosensitizing structure, in a controlled manner, so that an integration time interval $t_{int}$ starts after said reset electric pulse has been applied.

9. The optoelectronic apparatus according to claim 8, wherein said control mechanism is configured and arranged to apply said reset electric pulse immediately after the reading of the electrical signals generated at the transport channel has been carried out.

10. The optoelectronic apparatus according to claim 8, wherein the at least one optoelectronic device comprises said electrode, which is at least one of a top gate electrode, a bottom gate electrode, and a top electrode.

11. The optoelectronic apparatus according to claim 7, wherein said control mechanism comprises a controllable light source, and is configured and arranged to control said controllable light source:

to switch on said controllable light source to generate and emit a light pulse to illuminate an object during a time interval $t_{pls}$ including each integration time interval $t_{int}$ and the time interval, $t_{access}$ or $t_{frame}$, during which the electrical signal has been read, and to switch off said controllable light source during a switch off time interval $t_{off}$ of equal duration as $t_{int}$ and that is immediately consecutive to $t_{pls}$;

wherein the at least one optoelectronic device is arranged so that said light impinging on the photosensitizing structure is a portion of the light included in said light pulse once reflected by or transmitted through said object.

12. The optoelectronic apparatus according to claim 11, wherein said control mechanism is configured and arranged to control said controllable light source to periodically repeat said switching on and switching off of the controllable light source, to generate and emit further light pulses during corresponding further time intervals $t_{pls}$, each immediately after a respective further switch off interval $t_{off}$.

13. The optoelectronic apparatus according to claim 11, further comprising a bandpass filter, with centre wavelength around the wavelength of the light pulse and a predetermined bandwidth, placed over the photosensitizing structure.

14. A reading-out method, comprising performing the operations of a read-out unit of an optoelectronic apparatus comprising:

at least one optoelectronic device comprising:
a transport structure comprising at least one 2-dimensional layer;
a photosensitizing structure configured and arranged to absorb incident light and induce changes in the electrical conductivity of the transport structure by generating pairs of electric carriers, trapping a single type of electric carriers of said pairs therein, during a predetermined trapping time $T_{tr}$, to induce a change in the conductance of the transport structure; and
drain and source electrodes electrically connected to respective separate locations of said transport structure;

said read-out unit operatively connected to said drain and source electrodes to read an electrical signal generated at a transport channel created in said transport structure between the drain and source electrodes by the light impinging on said photosensitizing structure wherein the method comprises performing said reading of said electrical signal after an integration time interval $t_{int}$ has passed, and during a time interval $t_{access}$ that is at least 10 times shorter than $t_{int}$ wherein $t_{int}$ is longer than $T_{tr}$ and corresponds to the time interval during which integration of photo-generated electric charges occurs in the photosensitizing structure.

15. The optoelectronic apparatus according to claim 1, configured and arranged as a light detector.

16. The optoelectronic apparatus according to claim 1, configured and arranged as an image sensor.

17. The optoelectronic apparatus according to claim 3, wherein the read-out unit comprises a control mechanism configured and arranged to control and synchronize the timing of the integration of the photo-generated electric charges through a plurality of successive integration time intervals $t_{int}$ and remove excess electric charges from previous integration time intervals $t_{int}$, for each of the optoelectronic devices simultaneously.

18. The optoelectronic apparatus according to claim 17, wherein said control mechanism is configured and arranged to generate and apply a reset electric pulse to an electrode of each of the optoelectronic devices simultaneously, to remove the electric charges trapped in each of the photosensitizing structures, in a controlled manner, so that an integration time interval $t_{int}$ starts after said reset electric pulse has been applied.

19. The optoelectronic apparatus according to claim 18, wherein said control mechanism is configured and arranged to apply said reset electric pulse immediately after the reading of all of the electrical signals generated at the transport channels has been carried out.

20. The optoelectronic apparatus according to claim 17, wherein said control mechanism comprises a controllable light source, and is configured and arranged to control said controllable light source:
- to switch on said controllable light source to generate and emit a light pulse to illuminate an object during a time interval $t_{\_pls}$ including each integration time interval $t_{int}$ and the time interval, $t_{access}$ or $t_{frame}$, during which the electrical signals have been read, and
- to switch off said controllable light source during a switch off time interval $t_{\_off}$ of equal duration as $t_{int}$ and that is immediately consecutive to $t_{\_pls}$;

wherein each of the optoelectronic devices is arranged so that said light impinging on the photosensitizing structures is a portion of the light included in said light pulse once reflected by or transmitted through said object.

* * * * *